(12) United States Patent
Zhang et al.

(10) Patent No.: US 10,048,603 B2
(45) Date of Patent: Aug. 14, 2018

(54) ALIGNMENT METHOD AND ALIGNMENT SYSTEM THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Qiang Zhang, Shanghai (CN); Jing An Hao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (Beijing) CORPORATION, Beijing (CN)

( * ) Notice: Subject to any disclaimer, the term of this patent is extended or adjusted under 35 U.S.C. 154(b) by 0 days.

(21) Appl. No.: 15/587,544

(22) Filed: May 5, 2017

(65) Prior Publication Data
US 2017/0329241 A1 Nov. 16, 2017

(30) Foreign Application Priority Data

May 11, 2016 (CN) .......................... 2016 1 0309546

(51) Int. Cl.
*G03F 7/20* (2006.01)
*G03F 9/00* (2006.01)
(Continued)

(52) U.S. Cl.
CPC ........ *G03F 9/7015* (2013.01); *G03F 7/70775* (2013.01); *G03F 9/70* (2013.01);
(Continued)

(58) Field of Classification Search
CPC ............. G03F 7/70775; G03F 7/70783; G03F 9/7088; G03F 9/7049; G03F 9/7046;
(Continued)

(56) References Cited

U.S. PATENT DOCUMENTS

| 4,849,901 A | 7/1989 | Shimizu |
| 2004/0150707 A1* | 8/2004 | Stiblert ................ G01B 11/306 347/224 |
| 2013/0090877 A1 | 4/2013 | Nagai |

OTHER PUBLICATIONS

The European Patent Office (EPO) The Extended European Search Report for 17168685.0 dated Oct. 12, 2017 8 Pages.

* cited by examiner

*Primary Examiner* — Michelle M Iacoletti
(74) *Attorney, Agent, or Firm* — Anova Law Group, PLLC

(57) ABSTRACT

An alignment method and an alignment system are provided. The alignment method includes: providing a wafer including an exposed surface, wherein an alignment mark and a reference point with a reference distance are provided on the exposed surface; placing the wafer on a reference plane; performing an alignment measurement on the exposed surface to obtain a projection distance, configured as a measurement distance, between the alignment mark and the reference point on the reference plane; performing a levelling measurement between the exposed surface and the reference plane to obtain levelling data of the exposed surface; obtaining a distance, configured as an expansion reference value, between the alignment mark and the reference point in the exposed surface; obtaining an expansion compensation value based on a difference between the expansion reference value and the reference distance; and adjusting parameters of a photolithography process based on the expansion compensation value for an alignment.

20 Claims, 4 Drawing Sheets

(51) Int. Cl.
*H01L 21/67* (2006.01)
*H01L 21/68* (2006.01)
*H01L 23/544* (2006.01)

(52) U.S. Cl.
CPC .......... *G03F 9/7003* (2013.01); *G03F 9/7073* (2013.01); *H01L 21/67288* (2013.01); *H01L 21/68* (2013.01); *H01L 23/544* (2013.01); *H01L 2223/54426* (2013.01); *H01L 2223/54453* (2013.01)

(58) Field of Classification Search
CPC .... G03F 9/7015; G03F 9/7023; G03F 9/7034; G03F 9/7007; G03F 9/7011; G03F 9/7073
See application file for complete search history.

US 10,048,603 B2

ALIGNMENT METHOD AND ALIGNMENT SYSTEM THEREOF

CROSS-REFERENCES TO RELATED APPLICATIONS

This application claims the priority of Chinese patent application No. 201610309546.4, filed on May 11, 2016, the entirety of which is incorporated herein by reference.

FIELD OF THE DISCLOSURE

The present disclosure generally relates to the field of semiconductor manufacturing and, more particularly, relates to an alignment method and alignment system thereof.

BACKGROUND

Semiconductor manufacturing is a process of forming a stacked structure on a substrate by a variety of processes such as photolithography, etching, deposition, and implantation, etc. The correlation between different material layers in the stacked structure easily affects the performance of the semiconductor device.

To improve the performance of the semiconductor device, each patterned material layer needs to be aligned with the previously patterned material layer during the semiconductor manufacturing process. In other words, the semiconductor process needs to meet a certain overlay accuracy. If an alignment error is large, the performance of the semiconductor device is affected, and short circuit and/or device failure issues caused by misalignment of connection layers may even occur.

A photolithography technology is often used to transfer pattern on a mask to a wafer in the semiconductor manufacturing process. Therefore, the alignment of the mask to the wafer during the photolithography process is directly related to the alignment of the material layers in the wafer. Reducing the alignment error between the wafer and the mask can effectively improve the accuracy of the pattern provided in the material layer, and the alignment accuracy between the different patterned material layers.

However, the alignment method used in the existing photolithography process has a large alignment error issue. The disclosed device structures and methods are directed to solve one or more problems set forth above and other problems.

BRIEF SUMMARY OF THE DISCLOSURE

One aspect of the present disclosure includes an alignment method. The alignment method includes providing a wafer to be exposed including an exposed surface, wherein an alignment mark and a reference point configured as an exposure center are provided on the exposed surface, and a preset distance between the alignment mark and the reference point is a reference distance; and placing the wafer to be exposed on a reference plane. The alignment method also includes performing an alignment measurement on the exposed surface to obtain a projection distance between the alignment mark and the reference point on the reference plane, wherein the distance is configured as a measurement distance; and performing a levelling measurement between the exposed surface and the reference plane to obtain levelling data of the exposed surface between the reference point and the alignment mark. In addition, the alignment method includes obtaining a distance between the alignment mark and the reference point in the exposed surface based on the levelling data and the measurement distance, wherein the distance is configured as an expansion reference value; and obtaining an expansion compensation value based on a difference between the expansion reference value and the reference distance. Further, the alignment method includes adjusting parameters of a photolithography process based on the expansion compensation value for an alignment.

Another aspect of the present disclosure includes an alignment system. The alignment system includes an acquisition module configured to provide a wafer to be exposed and to place the wafer to be exposed on a reference plane, wherein an alignment mark and a reference point configured as an exposure center is provided on an exposed surface of the wafer to be exposed, and a preset distance between the alignment mark and the reference point is a reference distance. The alignment system also includes a measurement module connected to the acquisition module, configured to perform an alignment measurement on the exposed surface to obtain a projection distance between the alignment mark and the reference point on the reference plane, and the projection distance is configured as a measurement distance, and also configured to perform a levelling measurement between the exposed surface of the wafer and the reference plane to obtain levelling data of the exposed surface between the reference point and the alignment mark. In addition, the alignment system includes a calculation module, connected to the measurement module and the acquisition module, configured to obtain a distance between the alignment mark and the reference point in the exposed surface based on the levelling data and the measurement distance, and the distance is configured as an expansion reference value, and also configured to obtain an expansion compensation value based on a difference between the expansion reference value and the reference distance. Further, the alignment system includes a compensation module, connected to the calculation module, and configured to adjust parameters of a photolithography process based on the expansion compensation value for an alignment.

Other aspects of the present disclosure can be understood by those skilled in the art in light of the description, the claims, and the drawings of the present disclosure.

DETAILED DESCRIPTION

Figure 1:
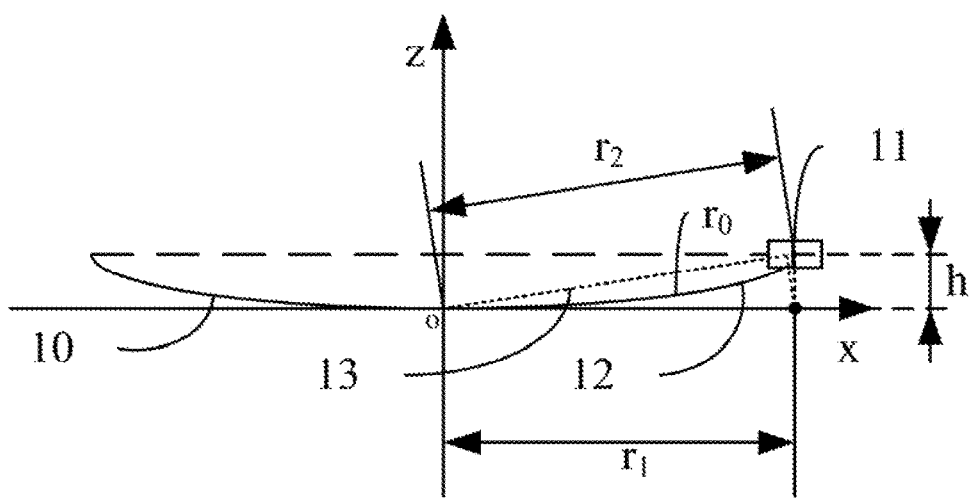
FIG. 1 illustrates an existing cross-sectional view of an exposed surface when a wafer is warped.

Reference will now be made in detail to exemplary embodiments of the disclosure, which are illustrated in the accompanying drawings. Wherever possible, the same reference numbers will be used throughout the drawings to refer to the same or the alike parts.

An alignment error of a photolithography exposure is mainly reflected in three aspects: translation, rotation and warpage of an exposed surface of a wafer. Therefore, an alignment method in the photolithography exposure may be mainly aimed at compensation of errors caused by the translation, rotation and warpage of the exposed surface of the wafer.

Before performing the photolithography exposure, based on the degree of the translation, rotation and warpage of the exposed surface, a translation compensation value (Tra), a rotation compensation value (Rot), and an expansion compensation value (Exp) are obtained, correspondingly. Based on the translation compensation value, the rotation compensation value, and the expansion compensation value, parameters of the photo lithography exposure are adjusted to achieve exposure alignment.

In the existing techniques, by scanning alignment mark previously provided on the exposed surface, the shape and position of the exposed surface can be obtained by a scanner of a photolithography station based on position information of the alignment marks. Based on the shape and position of the exposed surface, the parameters of the photolithography process are adjusted to achieve the exposure alignment.

However, the scanning of the position information of the alignment mark by the scanner is performed in a two-dimensional plane. For example, when the wafer is placed on a stage, the positon obtained by the scanner is a projection position of the alignment mark on a stage plane (the plane in which the stage surface is located). Therefore, the information obtained by the photolithography station based on the position information of the alignment mark is essentially a projection positon and a projection shape of the exposed surface on the stage plane.

When the wafer is not warped or when the exposed surface is an ideal plane, there is an error between the projection positon of the alignment mark and the real position of the alignment mark only in a direction perpendicular to the stage plane. Because light is projected to the exposed surface along a vertical direction when performing the photolithography exposure, the error does not affect the accuracy of the exposure alignment.

However, in a test cases, the wafer may be warped due to internal stress or stress relief. When the wafer is warped, the exposed surface may also be deformed accordingly. In other words, the exposed surface is no longer an ideal plane. Therefore, the error between the projection positon of the alignment mark obtained by the scanner and the real position of the alignment mark is not only in the direction perpendicular to the stage plane, but also in the stage plane. In this case, the error between the projection position and the real position of the alignment mark may affect the overlay accuracy, and cause a large error during the exposure process. In the existing techniques, the alignment error caused by wafer warpage is reduced by providing the expansion compensation value.

FIG. 1 illustrates a cross-sectional view of the exposed surface when the wafer is warped. Referring to FIG. 1, the wafer is warped due to the stress relief during a front end of line (FEOL) process, therefore, the cross section of the exposed surface 10 in the wafer is curved.

The wafer is placed on the wafer stage, and a surface of the wafer stage is configured as a reference plane. An alignment mask 11 and a reference point 'o' configured as an exposure center are provided on the exposed surface 10 of the wafer. A coordinate system 'XOZ' is established by using the reference point 'o' as the origin, a straight line passing through the reference point 'o' and the projection of the alignment mask 11 on the stage plane as the X-axis, and a straight line passing through the reference point and perpendicular to the reference plane as the Z-axis.

When performing the exposure alignment, an overlay error of the alignment mark 11 '$ovl_{11}$' is obtained based on a difference value between a projection distance '$r_1$' and a straight line distance '$r_2$'. The projection distance '$r_1$' is a distance between the projections of the alignment mark 11 and the reference point 'o' on the reference plane. The straight line distance '$r_2$' is a length of a line connecting the alignment mark 11 and the reference point 'o'. As such, $ovl_{11}=r_2-r_1=r_2-\sqrt{r_2^2-h^2}$, where 'h' is a height of a position of the exposed surface in the alignment mark 11 when the wafer is warped. In other words, 'h' is a distance between the alignment mark 11 and the stage plane.

The alignment mark 11 is often provided at the wafer edge. It is assumed that the straight line distance '$r_2$' between the alignment mark 11 and the reference point 'o' is equal to the wafer radius. When the wafer radius is 150 mm, and the warpage height 'h' is 50 μm, the overlay error '$ovl_{11}$' is 8.3 nm. Under the same wafer size, when the warpage height 'h' is 60 μm, the overlay error '$ovl_{11}$' is 12 nm. Therefore, when the warpage height 'h' changes 10 um, the overlay error '$ovl_{11}$' changes 3.7 nm.

Referring to FIG. 1, when the wafer is warped, the exposed surface of the wafer is curved. The straight line distance '$r_2$' between the alignment mark 11 and the reference point 'o' is a length of the spatial straight line between the alignment mark 11 and the reference point 'o'. However, the spatial straight line between the alignment mark 11 and the reference point 'o' is not within the exposed surface. Therefore, the obtained overlay error '$ovl_{11}$' is significantly different from the real overlay error at the time of exposure.

Further, when performing the exposure alignment, the expansion compensation value is obtained based on the overlay error '$ovl_{11}$'. Therefore, the expansion compensation value does not have a good compensation effect on the overlay error caused by the wafer warpage, and cannot effectively compensate the alignment error caused by the wafer warpage and deformation of the exposed surface, thus resulting in a large exposure alignment error.

To reduce the alignment error, correction on the wafer warpage can be performed by a high order wafer alignment (HOWA) system, or an advanced process control (APC) system, etc. The high order wafer alignment system needs to add alignment marks inside the wafer, and a measurement alignment needs to be performed on each alignment mask. However, the time required for performing the measurement alignment on the alignment mark is relatively long. Therefore, the time required for performing the correction on the wafer warpage by the high order wafer alignment system is relatively long, which may affect the production efficiency and reduce the production capacity.

The overlay error measurement is performed by the advanced process control system after completing the photolithography. Based on the overlay error measurement results of a former wafer, a compensation correction is performed on a latter wafer. Therefore, when the warpage conditions of the former and latter wafers are different, it is difficult to achieve a good alignment compensation by the advanced process control system.

Figure 2:
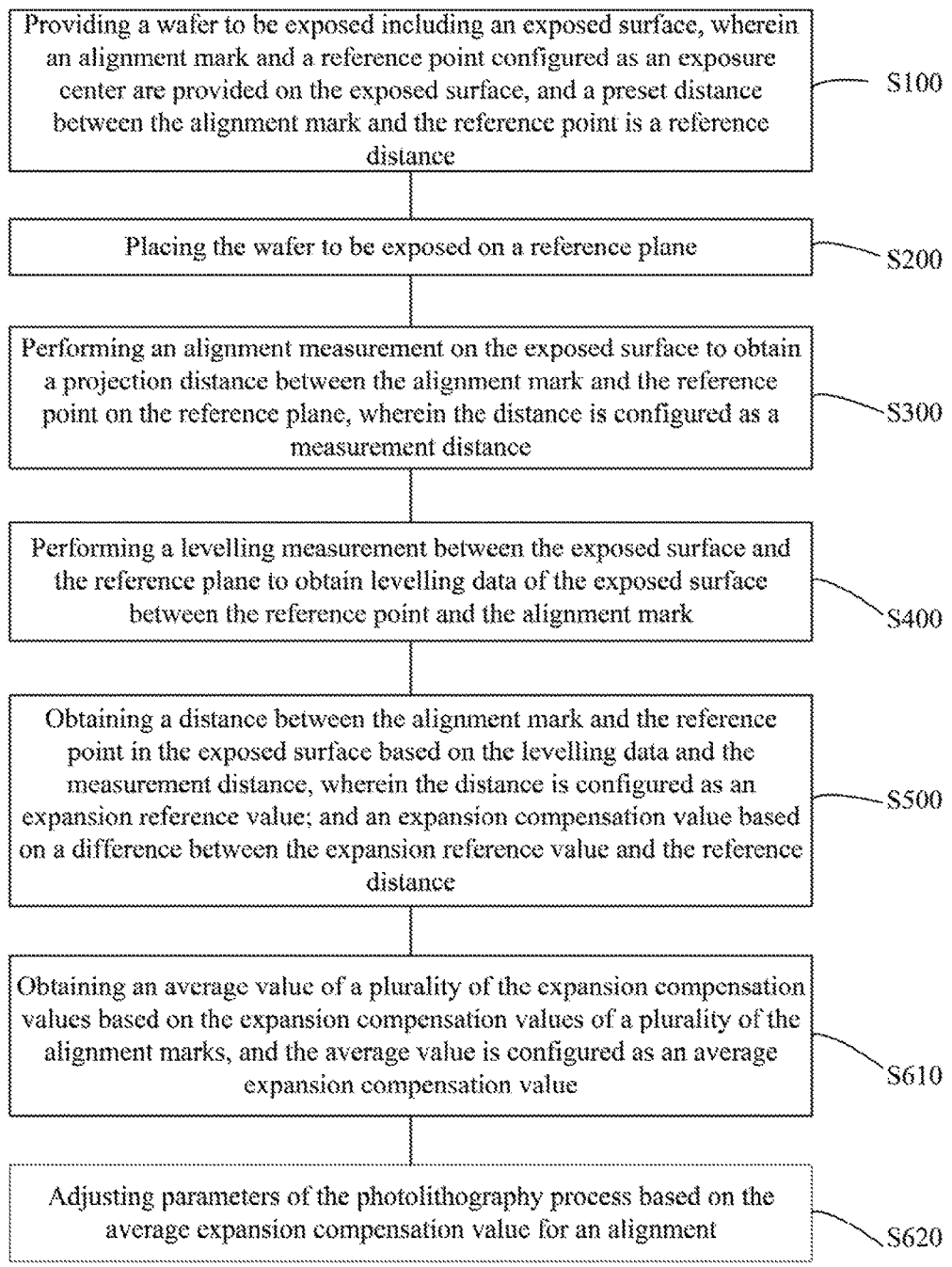
FIG. 2 illustrates an exemplary alignment method consistent with the disclosed embodiments.
Figure 3:
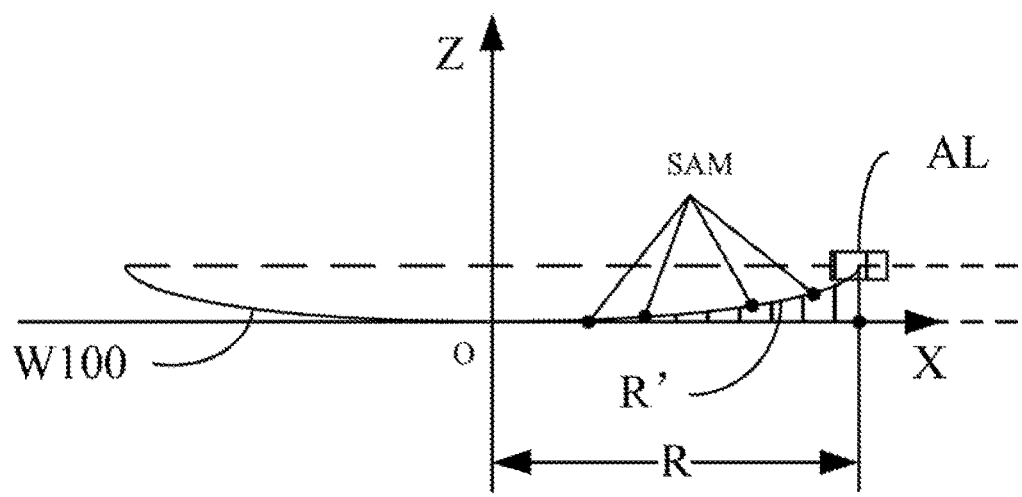
FIG. 3 illustrates a cross-sectional view of an exposed surface in a levelling section in an exemplary alignment method consistent with the disclosed embodiments.

The present disclosure provides an alignment method and alignment system. FIG. 2 illustrates an exemplary alignment method consistent with the disclosed embodiments; and FIG. 3 illustrates a cross-sectional view of an exposed surface in a levelling section in the exemplary alignment method consistent with the disclosed embodiments.

In one embodiment, the alignment method may be configured to perform a photolithography exposure alignment on a wafer in a back-end of line process. In certain embodiments, the alignment method may also be configured to perform the photolithography exposure alignment on the wafer in a front-end of line process.

As shown in FIG. 2, at the beginning of the alignment method, a wafer to be exposed with certain structures may be provided (S100).

For example, a wafer to be exposed may be provided. An alignment mark and a reference point configured as an exposure center may be provided on an exposed surface of the wafer to be exposed. A preset distance between the alignment mark and the reference point may be a reference distance '$R_0$'.

The alignment mark provided on the exposed surface may serve as a positioning function during the exposure alignment process. For example, a position coordinate of the alignment mark may be obtained by scanning. The position and shape of the exposed surface may be obtained based on the position coordinate of the alignment mark. Based on the position and shape of the exposed surface, an expansion compensation value may be provided to adjust photolithography conditions to achieve alignment.

In one embodiment, during the process of providing the wafer to be exposed, the alignment mark may be provided on the edge of the exposed surface. Therefore, the position information of the alignment mark can fully reflect the shape of the exposed surface, so as to improve accuracy of the shape of the exposed surface, and the alignment accuracy.

In certain embodiments, the alignment mark may be provided inside the exposed surface. When the alignment mark is provided inside the exposed surface, an expansion reference value may be obtained based on the extrapolation of the position coordinate of the alignment mark.

If the number of the alignment marks is too small, the scanning accuracy of the shape and position of the exposed surface may be affected, and the exposure alignment accuracy may be reduced. For example, the number of the alignment marks provided on the exposed surface may be larger than or equal to three. In one embodiment, the alignment marks may be evenly distributed on the wafer edge.

The reference point may serve as the exposure center during the exposure process. In one embodiment, the exposed surface may be a surface of the wafer to be exposed. In one embodiment, because the wafer is generally circular in shape, a center of the exposed surface may be configured as the reference point to reduce the measurement difficulty and the calculation amount.

The preset distance between the alignment mark and the reference point may be the reference distance '$R_0$'. When the product to be formed by the wafer to be exposed is determined, pattern of each material layer in the wafer to be exposed may be determined. In the pattern of the material layer, the preset distance between the alignment mark and the reference point may be the reference distance '$R_0$'.

Returning to FIG. 2, after providing the wafer to be exposed, the wafer to be exposed may be placed on a reference plane (S200).

For example, the wafer to be exposed may be placed on a reference plane. The reference plane may be configured as a measurement reference during a subsequent process of performing a levelling measurement to obtain levelling data.

For example, in one embodiment, the wafer to be exposed may be provided by a wafer stage of a photolithography station. Therefore, the process of placing the wafer to be exposed on the reference plane may include placing the wafer to be exposed on the wafer stage. The reference plane may be a surface of the wafer stage.

Returning to FIG. 2, after placing the wafer to be exposed on the reference plane, an alignment measurement may be performed (S300).

For example, an alignment measurement may be performed on the exposed surface to obtain a projection distance between the alignment mark and the reference point on the reference plane, and the projection distance may be configured as a measurement distance.

For example, the measurement distance may be obtained by directly measuring the distance between projections of the alignment mark and the reference point on the reference plane. Or the measurement distance may be obtained based on the coordinate information of the alignment mark and the reference point, which may be obtained by a scanner of the photolithography station.

In one embodiment, the alignment measurement may be performed on the exposed surface by the scanner of the phothlithography station. Because the scanner can only obtain the two-dimensional position information of the alignment mark on the reference plane, the measurement distance 'R' may be the distance between the projections of the alignment mark and the reference point on the reference plane.

For example, the projection of the alignment mark on the reference plane may be an alignment projection, and the projection of the reference point on the reference plane may be a reference projection. A distance between the alignment projection and the reference projection may be measured, and configured as the measurement distance 'R' during the process of obtaining the measurement distance.

Returning to FIG. 2, after obtaining the measurement distance, a levelling measurement between the exposed surface and the reference plane may be performed (S400).

For example, a levelling measurement between the exposed surface and the reference plane may be performed to obtain levelling data of the exposed surface between the reference point and the alignment mark.

The levelling data may include a levelling distance between the exposed surface and the reference plane, and a distribution of the levelling distance in the exposed surface. The levelling distance may be a distance between a different position on the exposed surface and the reference plane.

In one embodiment, the reference plane may be the stage plane. Therefore, the levelling distance may be the distance between the different position on the exposed surface and the stage plane. The levelling data may include the levelling distance and the distribution of the levelling distance in the exposed surface.

For example, the process of obtaining the levelling data may include: obtaining position coordinates of a plurality of sampling points in the exposed surface on the reference plane; measuring distances between a plurality of the sampling points and the reference plane, and the distances can be configured as the levelling distance; and obtaining a distribution of the levelling distance in the exposed surface based on the levelling distance and the position coordinates of the sampling points corresponding to the levelling distance, and the distribution can be configured as the levelling data. For example, the levelling data can be obtained by a levelling system of the scanner of the photolithography station.

In one embodiment, a section passing through the reference point and the alignment mark and perpendicular to the reference plane may be a levelling section. An intersection line of the levelling section and the exposed surface may be a calibration curve.

FIG. 3 illustrates a cross-sectional view of the exposed surface in the levelling section in the alignment method shown in FIG. 2. Referring to FIG. 3, to obtain information of the shape of the exposed surface between the alignment mark and the reference point, the process of obtaining the levelling data through the levelling measurement may include obtaining the levelling data corresponding to a calibration curve 'W100'. In other words, the process of obtaining position information of a plurality of the sampling points may include obtaining the position information of a plurality of the sampling points 'SAM' on the calibration curve. 'W100'. Therefore, the levelling data may include distance between a plurality of the sampling points 'SAM' and the reference plane, and the position coordinates of a plurality of the sampling points 'SAM'.

Returning to FIG. 2, after obtaining the levelling data and the measurement distance, an expansion reference value may be obtained (S500).

For example, a distance between the alignment mark and the reference point in the exposed surface may be obtained based on the levelling data and the measurement distance, and the distance may be configured as an expansion reference value. For example, the process of obtaining the expansion reference value may include first obtaining an expression of the calibration curve 'W100' on the levelling section based on the levelling data corresponding to the calibration curve 'W100'. For example, an intersection line of the levelling section and the reference plane may be a first straight line, and a straight line passing through the reference point and perpendicular to the reference plane may be a second straight line. A calibration coordinate system may be established by using the intersection of the first straight line and the second straight line as an origin, and the first straight line and the second straight line as coordinate axes.

Referring to FIG. 3, the calibration coordinate system 'XOZ' may be established by using the first straight line as the X axis, the second straight line as the Z axis, and the intersection of the first straight line and the second straight line as the origin 'O'. During the alignment measurement process, the obtained measurement distance may be the distance between the projections of the alignment mark and the reference point on the reference plane. In other words, a distance between the projection of the alignment mark 'AL' on the X axis and the origin 'O' may be the measurement distance 'R'.

Therefore, during the process of obtaining the expression of the calibration curve on the levelling section, the expression of the calibration curve may be obtained based on the calibration coordinate system. As shown in FIG. 3, the expression of the calibration curve may be obtained by a polynomial fitting based on the levelling data. In other words, the polynomial function representing the calibration curve 'W100' may be fitted based on the levelling data: $Z(X)=a_0+a_1*X+a_2*X^2+\ldots+a^n*X^n$.

The levelling data may include the distances between a plurality of the sampling points 'SAM' and the reference plane, and the position coordinates of a plurality of the sampling points 'SAM'. Therefore, coordinates $(X_i, Z_i)$ of a plurality of the sampling points 'SAM' in the calibration coordinate system 'XOZ' can be obtained based on the levelling data.

The coefficients $a_0, a_1, a_2, \ldots, a_n$ of the polynomial function representing the calibration curve 'W100' can be obtained based on the coordinates of a plurality of the sampling points 'SAM', therefore, the expression of the calibration curve 'W100' can be obtained: $Z(X)=a_0+a_1*X+a_2*X^2+\ldots+a^n*X^n$.

If the degree of the polynomial function representing the calibration curve 'W100' is too low, the error between the pattern of the polynomial function and the calibration curve 'W100' may be large, impacting the compensation accuracy and reducing the exposure alignment accuracy. Therefore, during the process of obtaining the expression of the calibration curve 'W100' by the polynomial fitting, the polynomial degree of the polynomial function representing the calibration curve 'W100' may be larger than or equal to three.

Because the polynomial degree of the polynomial function representing the calibration curve 'W100' may be larger than or equal to three, during the process of obtaining the coefficients of the polynomial function, the number of the preset sampling points 'SAM' may be larger than or equal to four.

In one embodiment, the method of using polynomial fitting to obtain the calibration curve 'W100' can reduce the fitting calculation amount, and improve the fitting efficiency and the alignment speed. In certain embodiments, the calibration curve may also be obtained by fitting an exponential function, or a logarithmic function, etc. Other curve fitting methods may also be used.

After obtaining the expression of the calibration curve, a length of the calibration curve 'W100' between the reference point and the alignment mark 'AL' may be obtained based on the expression and the measurement distance 'R'. The length may be configured as the expansion reference value 'R''.

For example, to improve the accuracy of the obtained length of the calibration curve and the compensation accuracy, the length of the calibration curve 'W100' between the reference point and the alignment mark 'AL' can be obtained by a curve integration, and the length may be configured as the expansion reference value 'R'': $R'=\int_0^R \sqrt{1+[Z(X)]^2}dX$.

The expansion reference value obtained based on the levelling data and the measurement distance may be the distance between the alignment mark 'AL' and the reference point in the exposed surface after considering the wafer is warped and the exposed surface is deformed. Therefore, the expansion reference value 'R'' may be closer to the real imaging conditions at the time of exposure.

After obtaining the expansion reference value 'R'', the expansion compensation value may be obtained based on a difference between the expansion reference value 'R'' and the reference distance '$R_0$'. For example, the process of obtaining the expansion compensation value may include first obtaining a difference value between the expansion reference value 'R'' and the reference distance '$R_0$'; and then using a ratio of the difference value to the reference distance to obtain the expansion compensation value 'EXP':

$$EXP = \frac{R_0 - R'}{R_0}.$$

In one embodiment, the method of obtaining the expansion compensation value 'EXP' by using the ratio of the difference value between the expansion reference value 'R'' and the reference distance '$R_0$' to the reference distance '$R_0$', that is, performing a first order compensation on the wafer warpage, has many advantages such as simple calculation, and high calculation efficiency, etc. In certain embodiments, a higher order compensation may be performed on the wafer warpage to further improve the compensation accuracy. Other methods may also be used.

Because the expansion reference value 'R'' is obtained after considering the wafer is warped and the exposed surface is deformed, the expansion reference value 'R'' may be closer to the real imaging conditions at the time of exposure. The accuracy of the expansion compensation value 'EXP' obtained based on the expansion reference value 'R'' and the reference distance '$R_0$' may be higher, and be beneficial to improve the overlay compensation accuracy and the exposure alignment accuracy.

After obtaining the expansion compensation value, parameters of the photolithography process may be adjusted based on the expansion compensation value to achieve alignment.

In one embodiment, a plurality of the alignment marks may be provided on the exposed surface of the wafer to be exposed. Therefore, referring to FIG. 2, the process of adjusting the parameters of the photolithography process based on the expansion compensation value may include a Step 610 and/or a Step 620.

For example, an average value of a plurality of the expansion compensation values may be obtained based on the expansion compensation values of a plurality of the alignment marks, and the average value may be configured as an average expansion compensation value.

For example, providing a plurality of the alignment marks on the exposed surface can effectively improve the exposure compensation accuracy and the alignment accuracy. An expansion compensation value can be obtained for each alignment mark. A plurality of the expansion compensation values can be obtained for a plurality of the alignment marks. The average value of a plurality of the expansion compensation values may be obtained based on the expansion compensation values of a plurality of the alignment marks, and the average value may be configured as the average expansion compensation value.

In one embodiment, the average expansion compensation value may be the average value of a plurality of the expansion compensation values of all the alignment marks. In certain embodiment, the average expansion compensation value may be obtained by weighted average of the expansion compensation values of a plurality of the alignment marks based on the specific structure of the semiconductor device formed in the wafer to be exposed. Other averaging methods may also be used according to various embodiments of present disclosure.

If the number of the alignment marks on the exposed surface is too small, the shape of the exposed surface cannot be fully obtained, and the accuracy of the obtained average expansion compensation value and the exposure alignment accuracy may be affected. Therefore, the number of the alignment marks provided on the exposed surface may be larger than or equal to three.

For example, the process of adjusting the parameters of the photolithography process based on the expansion compensation value to achieve the alignment may include adjusting the parameters of the photolithography process based on the average expansion compensation value.

Figure 4:
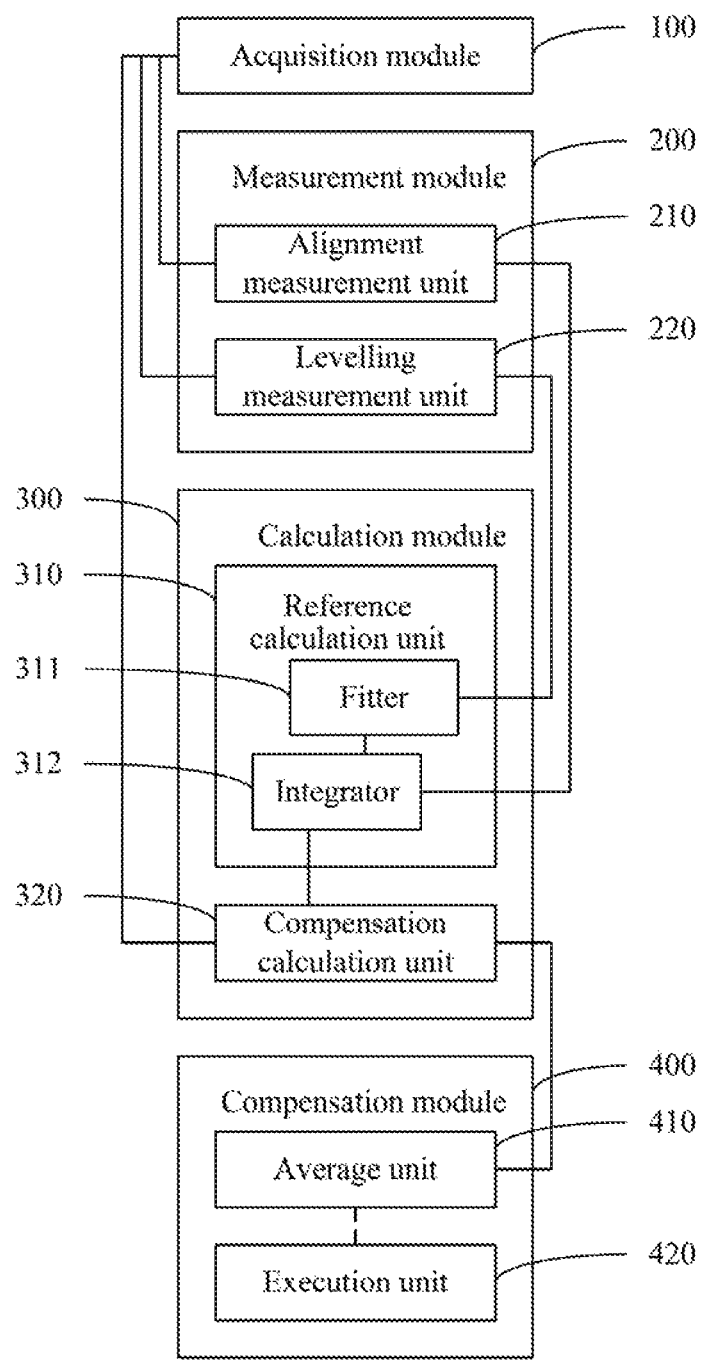
FIG. 4 illustrates a functional block diagram of an alignment system consistent with the disclosed embodiments.

Correspondingly, an alignment system is also provided in the present disclosure. FIG. 4 illustrates a functional block diagram of the alignment system consistent with the disclosed embodiments.

In one embodiment, the alignment system may be configured to perform a photolithography exposure alignment on the wafer in the back-end of line process. In certain embodiments, the alignment system may be configured to perform a photolithography exposure alignment on the wafer in the front-end of line process.

Referring to FIG. 4, the alignment system may include an acquisition module 100. The acquisition module may be configured to provide a wafer to be exposed. An alignment mark and a reference point configured as an exposure center may be provided on an exposed surface of the wafer to be exposed. A preset distance between the alignment mark and the reference point may be a reference distance. The acquisition module may also be configured to place the wafer to be exposed on a reference plane.

For example, the alignment system may be configured to perform the photolithography exposure alignment on the wafer to be exposed. Therefore, the acquisition module 100 may be a wafer static of a photolithography station. The wafer to be exposed may be placed on the wafer stage. The alignment system may obtain the wafer to be exposed by the wafer stage of the photolithography station.

The alignment mark provided on the exposed surface may serve as a positioning function during the exposure alignment process. For example, a position coordinate of the alignment mark may be obtained by a scanner in the alignment system. The position and shape of the exposed surface may be obtained based on the position coordinate of the alignment mark. Based on the position and shape of the exposed surface, an expansion compensation value may be provided to adjust photolithography conditions to achieve alignment.

In one embodiment, the alignment mark may be provided on the edge of the exposed surface. Therefore, position information of the alignment mark can fully reflect the shape of the exposed surface, and scanning accuracy of the shape of the exposed surface and the alignment accuracy can be improved.

In certain embodiments, the alignment mark may also be provided inside the exposed surface. When the alignment mark is provided inside the exposed surface, an expansion reference value may be obtained based on the extrapolation of the position coordinate of the alignment mark.

If the number of the alignment marks is too small, the scanning accuracy of the shape and position of the exposed surface may be affected, and the exposure alignment accuracy may be reduced. For example, the number of the alignment marks provided on the exposed surface may be larger than or equal to three. In one embodiment, the alignment marks may be evenly distributed on the wafer edge.

The reference point may serve as an exposure center during the exposure process. In one embodiment, the exposed surface may be a surface of the wafer to be exposed. In one embodiment, because the wafer is generally circular in shape, a center of the exposed surface may be configured as the reference point to reduce the measurement difficulty and the calculation amount.

The preset distance between the alignment mark and the reference point may be the reference distance '$R_0$'. When the product to be formed by the wafer to be exposed is determined, pattern of each material layer in the wafer to be exposed may have been determined. In the pattern of the material layer, the preset distance between the alignment mark and the reference point may be the reference distance '$R_0$'.

The acquisition module 100 may also be configured to place the wafer to be exposed on the reference plane. In one embodiment, the reference plane may be a surface of the wafer stage.

The alignment system may also include a measurement module 200. The measurement module may be connected to the acquisition module, and be configured to perform an alignment measurement on the exposed surface to obtain a projection distance between the alignment mark and the reference point on the reference plane, and the projection distance may be configured as a measurement distance. The measurement module may also be configured to perform a levelling measurement between the exposed surface of the wafer and the reference plane to obtain levelling data of the exposed surface between the reference point and the alignment mark.

For example, the measurement module 200 may include an alignment measurement unit 210 and a levelling measurement unit 220. The alignment measurement unit 210 may be connected to the acquisition module 100, and be configured to perform the alignment measurement on the exposed surface to obtain the projection distance between the alignment mark and the reference point on the reference plane, and the projection distance may be configured as the measurement distance 'R'.

For example, the alignment measurement unit 210 may be connected to the acquisition module 100, and be configured to obtain the exposed surface of the wafer to be exposed and the reference plane. The alignment measurement unit 210 may also be configured to perform the alignment measurement on the exposed surface to obtain the projection distance between the alignment mark and the reference point on the reference plane, the projection distance may be configured as the measurement distance 'R'.

For example, the alignment measurement unit 210 may be a measurement device of the photolithography station. The measurement distance 'R' may be obtained by directly measuring the distance between the alignment mark and the reference point on the reference plane. The alignment measurement unit 210 may also be a scanner of the photolithography station. The coordinate information of the alignment mark and the reference point may be obtained by scanning, and the measurement distance 'R' may be obtained based on the coordinate information of the alignment mark and the reference point.

In one embodiment, the alignment measurement unit 210 may be the scanner of the photolithography station. Because the scanner can only obtain two-dimensional position information of the alignment mark on the reference plane, the measurement distance 'R' may be the distance between the projections of the alignment mark and the reference point on the reference plane.

For example, a projection of the alignment mark on the reference plane may be an alignment projection, and a projection of the reference point on the reference plane may be a reference projection. a distance between the alignment projection and the reference projection may be measured by the alignment measurement unit 210, and the distance may be configure as the measurement distance 'R'.

The levelling measurement unit 220 may be connected to the acquisition module 100, and be configured to obtain the exposed surface of the wafer to be exposed and the reference plane. The levelling measurement unit 220 may also be configured to perform the levelling measurement between the exposed surface of the wafer and the reference plane to obtain the levelling data of the exposed surface between the reference point and the alignment mark.

The levelling data may include a levelling distance between the exposed surface and the reference plane, and a distribution of the levelling distance in the exposed surface. The levelling distance may be a distance between a different position on the exposed surface and the reference plane.

In one embodiment, the reference plane may be the stage plane. Therefore, the levelling distance may be a distance between the different position on the exposed surface and the stage plane. The levelling data may include the levelling distance and the distribution of the levelling distance in the exposed surface. Therefore, the levelling measurement unit 220 may be connected to the acquisition module 100, and be configured to obtain the exposed surface of the wafer to be exposed and the reference plane.

In addition, the levelling measurement unit 220 may also include a sampler, a measurement device, and a correlator. The sampler may be configured to obtain position coordinates of a plurality of sampling points in the exposed surface on the reference plane. The measurement device may be configured to measure the distance between a plurality of the sampling points and the reference plane, and the distance may be configured as the levelling distance. The correlator may be connected to the sampler, and be configured to obtain the position coordinates of a plurality of the sampling points obtained by the sampler. The correlator may be connected to the measurement device, and be configured to obtain the levelling distance of a plurality of the sampling points obtained by the measurement device. The correlator may also be configured to obtain the distribution of the levelling distance in the exposed surface based on the levelling distance and the position coordinates of the sampling points corresponding to the levelling distance. The distribution of the levelling distance in the exposed surface may be configured as the levelling data. For example, the levelling measurement unit 220 may be a levelling system of the scanner of the photolithography station.

In one embodiment, a section passing through the reference point and the alignment mark and perpendicular to the reference plane may be a levelling section. An intersection line of the levelling section and the exposed surface may be a calibration curve.

FIG. 3 illustrates a cross-sectional view of the exposed surface in the levelling section in the alignment system shown in FIG. 4. Referring to FIG. 3, in one embodiment, to obtain information of the shape of the exposed surface between the alignment mark and the reference point, the levelling measurement unit 220 may be configured to obtain the levelling data corresponding to the calibration curve 'W100'. In other words, the sampler may be configured to obtain position information of a plurality of the sampling points 'SAM' on the calibration curve 'W100'. Therefore, in one embodiment, the levelling data obtained by the levelling measurement unit 220 may include distance between a plurality of the sampling points 'SAM' and the reference plane, and position information of a plurality of the sampling points 'SAM'.

Referring to FIG. 4, in addition, the levelling system may include a calculation module 300. The calculation module 300 may be connected to the measurement module 200 and the acquisition module 100, and be configured to obtain a distance between the alignment mark and the reference point in the exposed surface based on the levelling data and the measurement distance, and the distance may be configured as an expansion reference value. The calculation module 300 may also be configured to obtain an expansion compensation value based on a difference between the expansion reference value and the reference distance.

For example, the calculation module 300 may include a reference calculation unit 310 and a compensation calculation unit 320. The reference calculation unit 310 may be connected to the measurement module 200, and be configured to obtain the distance between the alignment mark and the reference point in the exposed surface based on the levelling data and the measurement distance, and the distance may be configured as the expansion reference value.

Referring to FIG. 3, the reference calculation unit 310 may be configured to obtain a length of the calibration curve 'W100' between the reference point and the alignment mark by a curve fitting and a curve integration, and the length may be configured as the expansion reference value 'R''.

For example, the reference calculation unit 310 may include a fitter 311. The fitter 311 may be connected to the measurement module 200, and be configured to obtain an expression of the calibration curve 'W100' on the levelling section based on the levelling data corresponding to the calibration curve 'W100'. The fitter 311 may be connected to the alignment measurement unit 210, and be configured to obtain the measurement distance 'R' obtained by the alignment measurement unit 210 by performing the alignment measurement. The fitter 311 may also be connected to the levelling measurement unit 220, and be configured to obtain the levelling data obtained by the levelling measurement unit 220 by performing the levelling measurement, and the levelling data may correspond to the calibration curve 'W100'. The fitter 311 may also be configured to obtain the expression of the calibration curve 'W100' on the levelling section based on the levelling data and the measurement distance 'R'.

Referring to FIG. 3, an intersection of the levelling section and the reference plane may be a first straight line, and a straight line passing through the reference point and perpendicular to the reference plane may be a second straight line. A calibration coordinate system may be established by using an intersection of the first straight line and the second straight line as an origin, and the first straight line and the second straight line as coordinate axes.

For example, the calibration coordinate system 'XOZ' may be established by using the first straight line as the X axis, the second straight line as the Z axis, and the intersection of the first straight line and the second straight line as the origin 'O'.

The measurement distance obtained by the alignment measurement unit 210 may be the distance between the projections of the alignment mark and the reference point on the reference plane. In other words, a distance between a projection of the alignment mark 'AL' on the X axis and the origin 'O' may be the measurement distance 'R'.

Therefore, the expression of the calibration curve 'W100' may be obtained by the finer 311 based on the calibration coordinate system. Referring to FIG. 3, the expression of the calibration curve 'W100' may be obtained by a polynomial fitting based on the levelling data. In other words, a polynomial function representing the calibration curve 'W100' may be obtained by the fitter 311 based on the levelling data: $Z(X)=a_0+a_1*X+a_2*X^2+ \ldots +a''*X^n$.

The levelling data obtained by the levelling measurement unit 220 may include the distance between a plurality of the sampling points 'SAM' and the reference plane, and position information of a plurality of the sampling points 'SAM'. Therefore, after obtaining the levelling data by the fitter 311, coordinates $(X_i, Z_i)$ of a plurality of the sampling points 'SAM' in the calibration coordinate system 'XOZ' can be obtained based on the levelling data.

The fitter 311 may also be configured to obtain coefficients $a_0, a_1, a_2, \ldots, a_n$ of the polynomial function representing the calibration curve 'W100' based on the coordinates $(X_i, Z_i)$ of a plurality of the sampling points 'SAM', thus the expression of the calibration curve 'W100' can be obtained: $Z(X)=a_0+a_1*X+a_2*X^2+ \ldots +a''*X^n$.

If the degree of the polynomial function representing the calibration curve 'W100' is too low, the error between the pattern of the polynomial function and the calibration curve 'W100' may be large, the compensation accuracy may be impacted and the exposure alignment accuracy may be reduced. Therefore, the polynomial degree of the polynomial function representing the calibration curve 'W100' obtained by the fitter 311 may be larger than or equal to three.

Because the polynomial degree of the polynomial function representing the calibration curve 'W100' obtained by the fitter 311 may be larger than or equal to three, the preset number of the sampling points 'SAM' of the levelling data obtained by the levelling measurement unit 220 may be larger than or equal to four.

In one embodiment, the method of using the polynomial fitting to obtain the calibration curve 'W100' by the fitter 311 can reduce the fitting calculation amount, and improve the fitting efficiency and the alignment speed. In certain embodiments, the calibration curve may also be obtained by fitting an exponential function, or a logarithmic function, etc. Other curve fitting methods may also be used.

The reference calculation unit 310 may also include an integrator 312. The integrator 312 may be connected to the measurement module 200 and the fitter 311, and be configured to obtain a length of the calibration curve 'W100' between the reference point and the alignment mark 'AL' based on the expression $Z(X)$ and the measurement distance 'R', and the length may be configured as the expansion reference value 'R''.

For example, the integrator 312 may be connected to the fitter 311, and be configured to obtain the expression of the calibration curve 'W100' obtained by the fitter 311. The integrator 312 may be connected to the measurement module 200, and be configured to obtain the measurement distance 'R'. The integrator 312 may also be configured to obtain the length of the calibration curve 'W100' between the reference point and the alignment mark 'AL' based on the expression $Z(X)$ and the measurement distance 'R', and the length may be configured as the expansion reference value 'R''.

To improve the accuracy of the obtained length of the calibration curve and the compensation accuracy, the integrator 312 may be configured to obtain the length of the calibration curve 'W100' between the reference point and the alignment mark 'AL' by a curve integration, and the length may be configured as the expansion reference value 'R'':

$$R'=\int_0^R \sqrt{1+[Z(X)]^2}\,dX.$$

The expansion reference value 'R'' obtained by the alignment system based on the levelling data and the measurement data may be the distance between the alignment mark 'AL' and the reference point in the exposed surface after considering the wafer is warped and the exposed surface is deformed. Therefore, the expansion reference value 'R'' may be closer to the real imaging conditions at the time of exposure.

The calculation module 300 may also include the compensation calculation unit 320. The competisation calculation unit 320 may be connected to the reference calculation unit 310 and the acquisition module 100, and be configured to obtain the expansion compensation value 'EXP' based on a difference between the expansion reference value 'R'' and the reference distance '$R_0$'.

For example, the compensation calculation unit 320 may include a differential device. The differential device may be connected to the integrator 312, and be configured to obtain the expansion reference value 'R''. The differential device may be connected to the acquisition module 100, and be configured to obtain the reference distance '$R_0$'. The differential device may also be configured to obtain the difference value between the expansion reference value 'R'' and the reference distance '$R_0$'.

The compensation calculation unit 320 may also include a ratio device. The ratio device may be connected to the differential device, and be configured to obtain the difference value between the expansion reference value 'R'' and the reference distance '$R_0$'. The ratio device may be connected to the acquisition module 100, and be configured to obtain the reference distance '$R_0$'. The ratio device may also be configured to obtain a ratio of the difference value to the reference distance '$R_0$', and the ratio may be configured as the expansion compensation value 'EXP':

$$EXP = \frac{R_0 - R'}{R_0}.$$

In one embodiment, the method of obtaining the expansion compensation value 'EXP' by the compensation calculation unit 320 based on the ratio of difference value between the expansion reference value 'R'' and the reference distance '$R_0$' to the reference distance '$R_0$', that is, performing a first order compensation on the wafer warpage, may have many advantages such as simple calculation, and high calculation efficiency, etc. In certain embodiments, a higher order compensation may be performed on the wafer warpage by the compensation calculation unit 320 to further improve the compensation accuracy. Other methods may also be used.

Because the expansion reference value 'R'' is obtained by the reference calculation unit 310 after considering the wafer is warped and the exposed surface is deformed, the expansion reference value 'R'' may be closer to the real imaging conditions at the time of exposure. The accuracy of the expansion compensation value 'EXP' obtained by the compensation calculation unit 320 based on the expansion reference value 'R'' and the reference distance '$R_0$', may be higher, and be beneficial to improve the overlay compensation accuracy and the exposure alignment accuracy of the alignment system.

Referring to FIG. 4, further, the levelling system may include a compensation module 400. The compensation module 400 may be connected to the calculation module 300, and be configured to adjust parameters of the photolithography process based on the expansion compensation value 'EXP' to achieve the alignment.

In one embodiment, a plurality of the alignment marks may be provided on the exposed surface of the wafer to be exposed obtained by the acquisition module 100. Therefore, an expansion compensation value may be obtained by the compensation calculation unit 320 for each alignment mark. Therefore, the compensation module 400 may be connected to the calculation module 300, and obtain a plurality of expansion compensation values fur a plurality of the alignment marks.

The compensation module 400 may include an average unit 410. The average unit 410 may be connected to the calculation module 300, and be configured to obtain an average value of a plurality of the expansion compensation values based on the expansion compensation values of a plurality of the alignment marks, and the average value may be configured as the average expansion compensation value.

In one embodiment, the average value of a plurality of the expansion compensation values of all the alignment marks obtained by the average unit 410 may be configured as the average expansion compensation value. In certain embodiment, the average expansion compensation value may be obtained by weighted average of the expansion compensation values of a plurality of the alignment marks based on the specific structure of the semiconductor device formed in the wafer to be exposed. Other averaging methods may also be used according to various embodiments of present disclosure.

If the number of the alignment marks on the exposed surface is too small, the shape of the exposed surface cannot be fully obtained, and the accuracy of the obtained average expansion compensation value and the exposure alignment accuracy may be impacted. Therefore, the number of the alignment marks provided on the exposed surface may be larger than or equal to three.

The compensation module 400 may also include an execution unit 420. The execution unit 420 may be connected to the average unit 410, and be configured to adjust the parameters of the photolithography process based on the average expansion compensation value.

For example, the execution unit 420 may be connected to the average unit 410, and be configured to obtain the average expansion compensation value obtained by the average unit 410. The execution unit 420 may also be connected to other devices of the photolithography station, and be configured to adjust the parameters of the photolithography process based on the average expansion compensation value to achieve the alignment.

Accordingly, the distance between the alignment mark and the reference point in the exposed surface of the wafer may be obtained based on the levelling data and the measurement distance of the alignment mark, and the distance may be configured as the expansion reference value. The expansion compensation value may be obtained based on the expansion reference value. The levelling data of the exposed surface may be added when calculating the expansion compensation value. The real distance between the alignment mark and the reference point in the exposed surface can be obtained without increasing the number of the alignment marks, thereby effectively reducing the impact of wafer warpage on the exposure alignment error, and improving compensation accuracy of the obtained exposure compensation value and the alignment accuracy.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the actual scope of the present disclosure.

What is claimed is:

1. An alignment method, comprising:
   providing a wafer to be exposed including a to-be-exposed surface, wherein an alignment mark and a reference point configured as an exposure center are provided on the to-be-exposed surface, and a preset distance between the alignment mark and the reference point is a reference distance;
   placing the wafer to be exposed on a reference plane;

performing an alignment measurement on the to-be-exposed surface to obtain a projection distance between the alignment mark and the reference point on the reference plane, wherein the distance is designated as a measurement distance;

performing a levelling measurement between the to-be-exposed surface and the reference plane to obtain levelling data of the to-be-exposed surface between the reference point and the alignment mark;

obtaining a distance between the alignment mark and the reference point in the to-be-exposed surface based on the levelling data and the measurement distance, wherein the distance is designated as an expansion reference value;

obtaining an expansion compensation value based on a difference between the expansion reference value and the reference distance; and adjusting parameters of a photolithography process based on the expansion compensation value for an alignment.

2. The method according to claim 1, wherein:

a plurality of alignment marks are provided on the to-be-exposed surface;

the number of the alignment marks provided on the to-be-exposed surface is larger than or equal to three; and the alignment marks are provided on an edge of the to-be-exposed surface.

3. The method according to claim 1, wherein placing the wafer to be exposed on the reference plane includes:

placing the wafer to be exposed on a wafer stage, wherein the reference plane is a surface of the wafer stage.

4. The method according to claim 1, wherein obtaining the levelling data includes:

obtaining position coordinates of a plurality of sampling points in the to-be-exposed surface on the reference plane;

measuring a distance between a plurality of the sampling points and the reference plane, wherein the distance is designated as a levelling distance; and obtaining a distribution of the levelling distance in the to-be-exposed surface based on the levelling distance and the position coordinates of the sampling points corresponding to the levelling distance, wherein the distribution is configured as the levelling data.

5. The method according to claim 1, further including:

designating a section passing through the reference point and the alignment mark and perpendicular to the reference plane as a levelling section; and designating an intersection line of the levelling section and the to-be-exposed surface as a calibration curve.

6. The method according to claim 5, wherein obtaining the levelling data includes:

obtaining the levelling data corresponding to the calibration curve.

7. The method according to claim 5, wherein obtaining the expansion reference value includes:

obtaining an expression of the calibration curve on the levelling section based on the levelling data corresponding to the calibration curve; and obtaining a length of the calibration curve between the reference point and the alignment mark based on the expression and the measurement distance, wherein the length is designated as the expansion reference value.

8. The method according to claim 7, wherein obtaining the expression of the calibration curve on the levelling section includes:

obtaining the expression of the calibration curve by a polynomial fitting based on the levelling data, wherein a polynomial degree of a polynomial function representing the calibration curve is larger than or equal to three.

9. The method according to claim 7, wherein, when obtaining the length of the calibration curve:

the length of the calibration curve is obtained by a curve integration.

10. The method according to claim 5, wherein:

an intersection line of the levelling section and the reference plane is a first straight line;

a straight line passing through the reference point and perpendicular to the reference plane is a second straight line;

a calibration coordinate system is established by using an intersection of the first straight line and the second straight line as an origin, and the first straight line and the second straight line as coordinate axes; and an expression of the calibration curve is obtained based on the calibration coordinate system during the process of obtaining the expression of the calibration curve on the levelling section.

11. The method according to claim 1, wherein obtaining the expansion compensation value includes:

obtaining a difference value between the reference distance and the expansion reference value; and using a ratio of the difference value to the reference distance as the expansion compensation value.

12. The method according to claim 1, wherein adjusting the parameters of the photolithography process based on the expansion compensation value includes:

obtaining an average value of a plurality of the expansion compensation values based on the expansion compensation values of a plurality of the alignment marks, wherein the average value is designated as an average expansion compensation value; and adjusting the parameters of the photolithography process based on the average expansion compensation value for the alignment.

13. An alignment system, comprising:

an acquisition module, configured to provide a wafer to be exposed and to place the wafer to be exposed on a reference plane, wherein an alignment mark and a reference point configured as an exposure center is provided on a to-be-exposed surface of the wafer to be exposed, and a preset distance between the alignment mark and the reference point is a reference distance;

a measurement module, connected to the acquisition module, configured to perform an alignment measurement on the to-be-exposed surface to obtain a projection distance between the alignment mark and the reference point on the reference plane, and the projection distance is designated as a measurement distance, and also configured to perform a levelling measurement between the to-be-exposed surface of the wafer and the reference plane to obtain levelling data of the to-be-exposed surface between the reference point and the alignment mark;

a calculation module, connected to the measurement module and the acquisition module, configured to obtain a distance between the alignment mark and the reference point in the to-be-exposed surface based on the levelling data and the measurement distance, and the distance is designated as an expansion reference value, and also configured to obtain an expansion compensation value based on a difference between the expansion reference value and the reference distance; and a compensation module, connected to the calculation module, and configured to adjust parameters of a photolithography process based on the expansion compensation value for an alignment.

14. The alignment system according to claim 13, wherein:
the acquisition module includes a wafer stage of a photolithography station;
the wafer to be exposed is placed on the wafer stage;
the reference plane is a surface of the wafer stage;
a plurality of alignment marks are provided on the to-be-exposed surface; and
the number of the alignment marks provided on the to-be-exposed surface is larger than or equal to three.

15. The alignment system according to claim 13, wherein the measurement module includes:
an alignment measurement unit, connected to the acquisition module, and configured to perform the alignment measurement on the to-be-exposed surface to obtain the projection distance between the alignment mark and the reference point on the reference plane, and the projection distance is designated as the measurement distance; and
a levelling measurement unit, connected to the acquisition module, and configured to perform the levelling measurement between the to-be-exposed surface of the wafer and the reference plane to obtain the levelling data of the to-be-exposed surface between the reference point and the alignment mark.

16. The alignment system according to claim 13, wherein:
a section passing through the reference point and the alignment mark and perpendicular to the reference plane is a levelling section;
an intersection line of the levelling section and the to-be-exposed surface is a calibration curve; and
the levelling data corresponding to the calibration curve is obtained by the measurement module.

17. The alignment system according to claim 13, wherein the calculation module includes:

a reference calculation unit, connected to the measurement module, and configured to obtain the distance between the alignment mark and the reference point in the to-be-exposed surface based on the levelling data and the measurement distance, and the distance is designated as the expansion reference value; and
a compensation calculation unit, connected to the reference calculation unit and the acquisition module, and configured to obtain the expansion compensation value based on the difference between the expansion reference value and the reference distance.

18. The alignment system according to claim 17, wherein the reference calculation unit includes:
a fitter, connected to the measurement module, and configured to obtain an expression of the calibration curve on the levelling section based on the levelling data corresponding to the calibration curve; and
an integrator, connected to the measurement module and the fitter, and configured to obtain a length of the calibration curve between the reference point and the alignment mark based on the expression and the measurement distance, and the length is designated as the expansion reference value.

19. The alignment system according to claim 18, wherein:
the expression of the calibration curve is obtained by the fitter by a polynomial fitting based on the levelling data; and
the length of the calibration curve is obtained by the integrator by a curve integration.

20. The alignment system according to claim 13, wherein the compensation module includes:
an average unit, connected to the calculation module, and configured to obtain the average value of a plurality of the expansion compensation values based on the expansion compensation values of a plurality of the alignment marks, and the average value is configured as the average expansion compensation value; and
an execution unit, connected to the average unit, and configured to adjust the parameters of the photolithography process based on the average expansion compensation value.

* * * * *